(12) United States Patent
Yamazaki

(10) Patent No.: US 8,581,355 B2
(45) Date of Patent: Nov. 12, 2013

(54) MICRO ELECTRIC MECHANICAL SYSTEM DEVICE AND METHOD OF PRODUCING THE SAME

(75) Inventor: Hiroaki Yamazaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 117 days.

(21) Appl. No.: 12/470,659

(22) Filed: May 22, 2009

(65) Prior Publication Data

US 2009/0289313 A1 Nov. 26, 2009

(30) Foreign Application Priority Data

May 26, 2008 (JP) ................................. 2008-136618

(51) Int. Cl.
*H01L 29/84* (2006.01)

(52) U.S. Cl.
USPC .................... 257/415; 257/E29.324; 257/417

(58) Field of Classification Search
USPC ................... 257/415, E29.324, 417
See application file for complete search history.

(56) References Cited

U.S. PATENT DOCUMENTS

| | | | |
|---|---|---|---|
| 6,744,335 B2 | 6/2004 | Ryhanen et al. | |
| 6,992,878 B2 | 1/2006 | Shimanouchi et al. | |
| 7,224,245 B2 | 5/2007 | Song et al. | |
| 7,659,150 B1* | 2/2010 | Monadgemi et al. | 438/125 |
| 2006/0108675 A1* | 5/2006 | Colgan et al. | 257/684 |
| 2006/0179642 A1 | 8/2006 | Kawamura | |
| 2006/0292729 A1 | 12/2006 | Ohguro | |
| 2007/0222007 A1* | 9/2007 | Van Beek et al. | 257/415 |
| 2008/0093685 A1* | 4/2008 | Watanabe et al. | 257/415 |
| 2009/0042372 A1* | 2/2009 | Nunan | 438/486 |

FOREIGN PATENT DOCUMENTS

| | | |
|---|---|---|
| JP | 2006-229282 | 8/2006 |
| JP | 2007-994 | 1/2007 |
| JP | 2008-105112 | 5/2008 |

OTHER PUBLICATIONS

Office Action issued Oct. 2, 2012 in Japanese Application No. 2008-136618 (With English Translation).

* cited by examiner

*Primary Examiner* — Timor Karimy
(74) *Attorney, Agent, or Firm* — Oblon, Spivak, McClelland, Maier & Neustadt, L.L.P.

(57) ABSTRACT

A MEMS device comprises a substrate, an island-shaped first insulating layer formed on the substrate, a second insulating film formed on the top and side surfaces of the first insulating layer and the top surface of the substrate, and having a thickness smaller than that of the first insulating layer, a metal layer formed on the second insulating film in an island-shaped region where the first insulating layer is formed, and a MEMS system element formed on the metal layer.

18 Claims, 6 Drawing Sheets

US 8,581,355 B2

MICRO ELECTRIC MECHANICAL SYSTEM DEVICE AND METHOD OF PRODUCING THE SAME

CROSS-REFERENCE TO RELATED APPLICATIONS

This application is based upon and claims the benefit of priority from the prior Japanese Patent Application No. 2008-136618 filed on May 26, 2008; the entire contents of which are incorporated herein by reference.

BACKGROUND

A high-frequency micro electro mechanical system (hereinafter referred to as MEMS) element formed on a semiconductor substrate of silicon or the like can be formed easily by using a conventional semiconductor manufacturing process and another nanometer-fabrication process. However, it has a disadvantage that high-frequency characteristics are deteriorated because of parasitic capacitance between a signal line and a silicon substrate.

To decrease the parasitic capacitance between the signal line and the silicon substrate, it may be required to form an insulating film having a thickness of 10 μm or more for a lower layer of the signal line.

As the insulating film which is a lower layer of the signal line, a silicon oxide film (hereinafter referred to as CVD film) produced by a CVD (Chemical Vapor Deposition) method is conventionally used. Such a CVD film is hardly formed to have a thickness of 10 μm or more. Therefore, there is proposed a structure that a coated layer of a resin such as polyimide is formed on a semiconductor substrate, and a CVD film is additionally formed on it (see, for example, JP-A 2006-229282 (KOKAI)).

But, when the coated layer of the resin such as polyimide is formed on the entire top surface of the semiconductor substrate and the CVD film is formed on it, a large stress acts on the CVD film in a subsequent heating step or the like due to a difference in thermal expansion coefficient from the resin coated layer.

SUMMARY

A MEMS device according to an aspect of the present invention comprises a substrate; an island-shaped first insulating layer formed on the substrate; a second insulating film formed on the top and side surfaces of the first insulating layer and the top surface of the substrate, and having a thickness smaller than those of the first insulating layer; a metal layer formed on the second insulating film in an island-shaped region where the first insulating layer is formed; and a MEMS element formed on the metal layer.

A method of producing an MEMS device according to an aspect of the present invention comprises forming an island-shaped first insulating layer on a substrate; forming a second insulating film having a thickness smaller than that of the first insulating layer on the top and side surfaces of the first insulating layer and the top surface of the substrate; forming a pattern of a metal layer on the second insulating film formed on the island-shaped first insulating layer; etching the second insulating film and forming a first opening to expose the metal layer; forming a sacrifice layer on the first opening of the second insulating film; forming a MEMS structure body on the sacrifice layer; and removing the sacrifice layer to release a movable portion of the MEMS structure body.

DETAILED DESCRIPTION OF THE INVENTION

Hereinafter, embodiments of the invention will be described. The embodiments will be described with reference to drawings, which are provided for illustration only, and the present invention is not limited to the drawings.

Figure 1A:
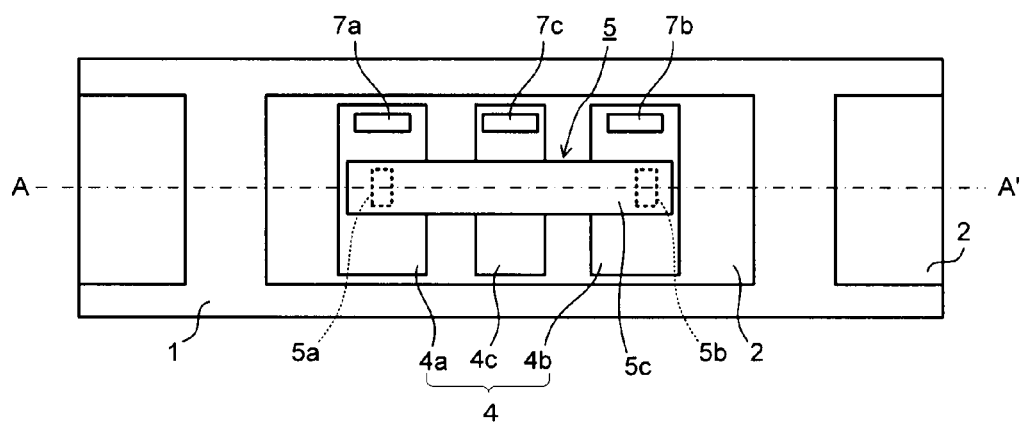
FIG. 1A is a plan view showing a structure of an MEMS device according to a first embodiment of the invention.
Figure 1B:
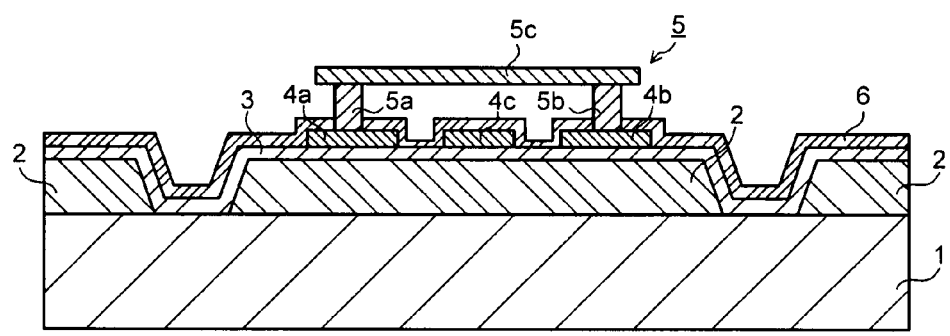
FIG. 1B is an A-A' sectional view of FIG. 1A.

FIG. 1A is a plan view showing a structure of the MEMS device according to a first embodiment. FIG. 1B is an A-A' sectional view of FIG. 1A. FIG. 1A shows a state that an inorganic insulating film and an insulating passivation film are omitted.

As shown in FIG. 1A and FIG. 1B, the MEMS device of the first embodiment includes a semiconductor substrate 1 such as a silicon substrate, an insulating coated layer 2 which is formed to have an island shape on the semiconductor substrate 1, an inorganic insulating film 3 which is formed on the entire surface of the semiconductor substrate 1 to cover the island-shaped insulating coated layer 2, a metal layer 4 which is formed like a pattern on the inorganic insulating film 3 on the island-shaped region where the insulating coated layer 2 is formed, and an MEMS element 5 formed on the patterned metal layer 4. The pattern of the metal layer 4 is comprised of a pattern of one pair of ground lines 4a, 4b, and a pattern of a signal line 4c formed between them. An insulating passivation film 6 is formed on the metal layer 4 and the inorganic insulating film 3.

The island-shaped insulating coated layer 2 is desirably a layer made of an insulating resin such as photosensitive polymide or an SOG (spin on glass) film, and formed by coating a viscous organic or inorganic insulating material by spin coating or the like and patterning. The insulating coated layer 2 has desirably a thickness of 10 μm or more. The insulating coated layer 2 is formed by patterning into a several hundreds micrometer square to several millimeter square island shape, and one MEMS element 5 is formed for one island-shaped insulating coated layer 2.

The inorganic insulating film 3 is preferably a TEOS film, namely a silicon oxide film ($SiO_2$ film) which is formed by a CVD method using TEOS (tetraethoxysilane) as a raw material gas, or a $SiO_2$ film formed by a plasma CVD method or the like. The inorganic insulating film 3 can be made to have a thickness of about 1 μm which is smaller than that of the island-shaped insulating coated layer 2.

The ground lines 4a, 4b and the signal line 4c are made of, for example, metal such as Au, Cr, Rt, Ti, Ni, Al or Cu, or an alloy of them. A single layer of the above metal or alloy, or a multilayer film which is formed by depositing thin films of the above metal or alloy can be used. And, the ground lines 4a, 4b and the signal line 4c have pads 7a, 7b, 7c for connection with the outside.

The MEMS element 5 has supporting portions 5a, 5b which are formed to protrude on the individual ground lines 4a, 4b, and a movable portion 5c which is mounted between the supporting portions 5a, 5b. The supporting portions 5a, 5b are electrically connected to the corresponding ground lines 4a, 4b. The movable portion 5c is electrically connected to the supporting portions 5a, 5b. The supporting portions 5a, 5b and the movable portion 5c are made of metal such as Al or Ni.

The MEMS device according to the first embodiment can be produced as follows. FIG. 2A to FIG. 2D are sectional views showing steps of producing the MEMS device of the first embodiment.

Figure 2A:
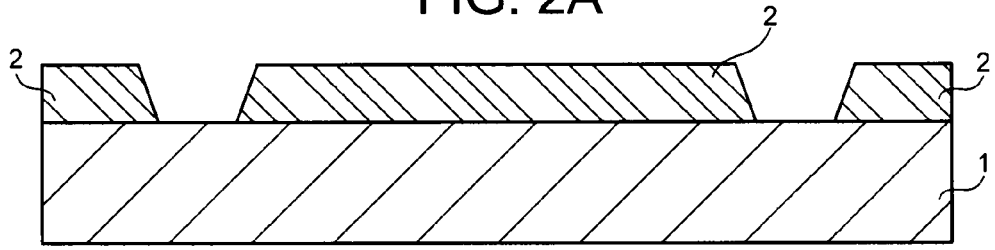
FIG. 2A to FIG. 2D are sectional views showing individual steps of a method of producing the MEMS device according to the first embodiment of the invention.

As shown in FIG. 2A, an insulation coating liquid such as photosensitive polyimide is coated on the semiconductor substrate 1 such as a silicon substrate by a spin coating method or the like. The isolated island-shaped region is formed by the photolithography. Thus, the island-shaped insulating coated layer 2 having a thickness of 10 μm or more is formed.

Figure 2B:
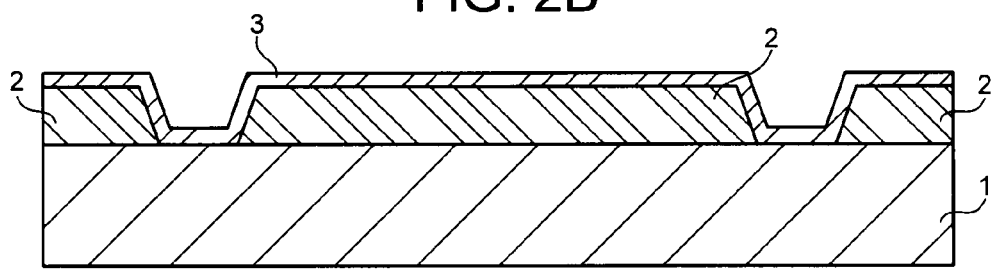

Then, as shown in FIG. 2B, the inorganic insulating film 3 such as a $SiO_2$ film is formed on the entire surface of the semiconductor substrate 1 to cover the island-shaped insulating coated layer 2 by, for example, the CVD method using TEOS as raw material gas.

Figure 2C:
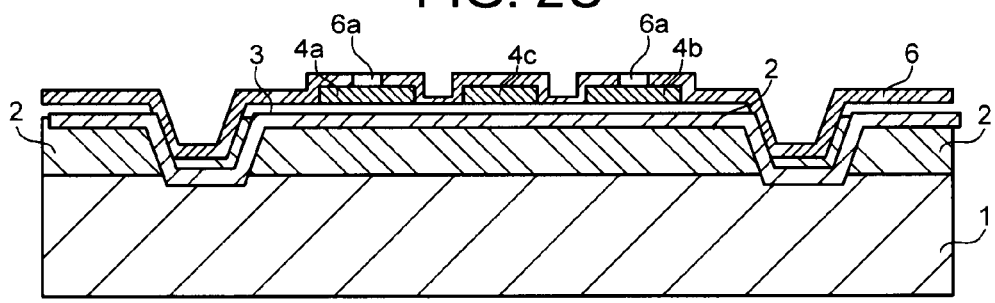

As shown in FIG. 2C, in the island-shaped region where the insulating coated layer 2 is formed, a metal thin film is formed on the inorganic insulating film 3 by a sputtering method, a metal deposition method or the like, and patterning is performed by photolithography and etching to form a pattern of the signal line 4c and a pattern of the ground lines 4a, 4b. Then, the insulating passivation film 6 is formed on the inorganic insulating film 3 by the CVD method or the like to cover the pattern of the signal line 4c and the pattern of the ground lines 4a, 4b, and connecting openings 6a are formed in the insulating passivation film 6 on the ground lines 4a, 4b by photolithography and etching. And, the MEMS element 5 is formed on the insulating passivation film 6 in which the connecting openings 6a are formed.

Figure 2D:
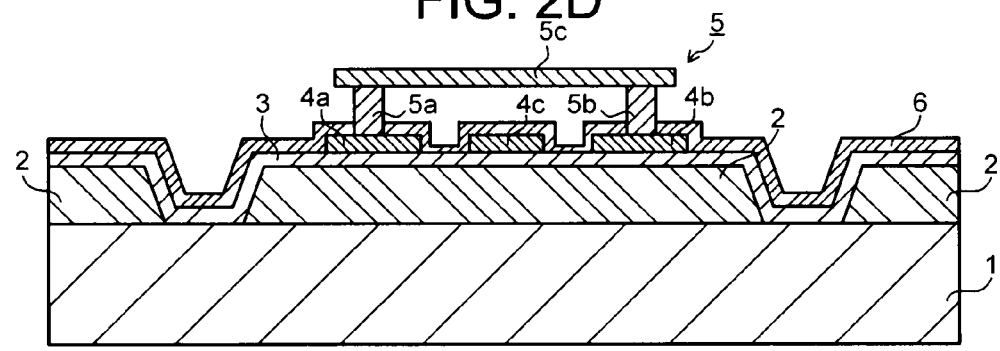

To form the MEMS element 5, a sacrifice layer (not shown) is formed on the insulating passivation film 6 of the region, where the signal line 4c and the ground lines 4a, 4b are formed, using, for example, the same material as that of the insulating coated layer 2, and the supporting portions 5a, 5b and the movable portion 5c of the MEMS structure body are formed on it by a conventional method. The supporting portions 5a, 5b are formed to be connected to the ground lines 4a, 4b through the connecting openings 6a of the insulating passivation film 6. The movable portion 5c is formed to be disposed between the supporting portions 5a, 5b. Then, the sacrifice layer is removed by plasma etching or the like to make the movable portion 5c as shown in FIG. 2D.

In the MEMS device according to the first embodiment, the insulating coated layer 2 formed on the semiconductor substrate 1 is formed into an island-shaped pattern on each of the MEMS elements 5, and the inorganic insulating film 3 is formed by coating on the island-shaped insulating coated layer 2, so that the volume of the insulating coated layer 2 is decreased in comparison with a structure that the insulating coated layer 2 is formed on the entire surface of the semiconductor substrate 1. Therefore, a stress due to the difference of the thermal expansion coefficient between the insulating coated layer 2 and the inorganic insulating film 3 is decreased. As a result, a crack is suppressed from generating in the insulating coated layer 2 and the inorganic insulating film 3 in the heating step.

Figure 3:
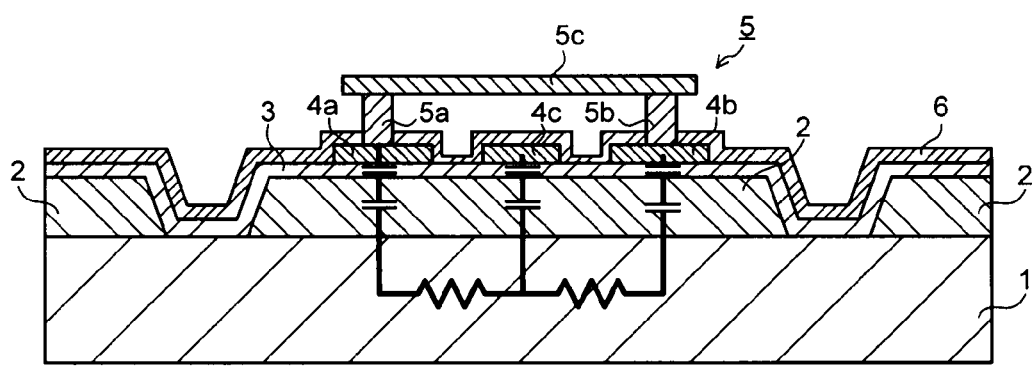
FIG. 3 is a diagram showing the substrate as an equivalent circuit in the MEMS device shown in FIG. 1.

As shown in the equivalent circuit diagram of FIG. 3, individual capacitances of the insulating coated layer 2 which is a thick film and the inorganic insulating film 3 which is a thin film and laminated thereon are connected in series between the semiconductor substrate 1 and the signal line 4c for supplying a high-frequency electric signal to the MEMS element 5, so that the parasitic capacitance is decreased in comparison with a device that has neither the insulating coated layer 2 nor the inorganic insulating film 3. Since the insulating coated layer 2 has a thickness of 10 μm or more, the parasitic capacitance can be decreased.

Figure 4A:
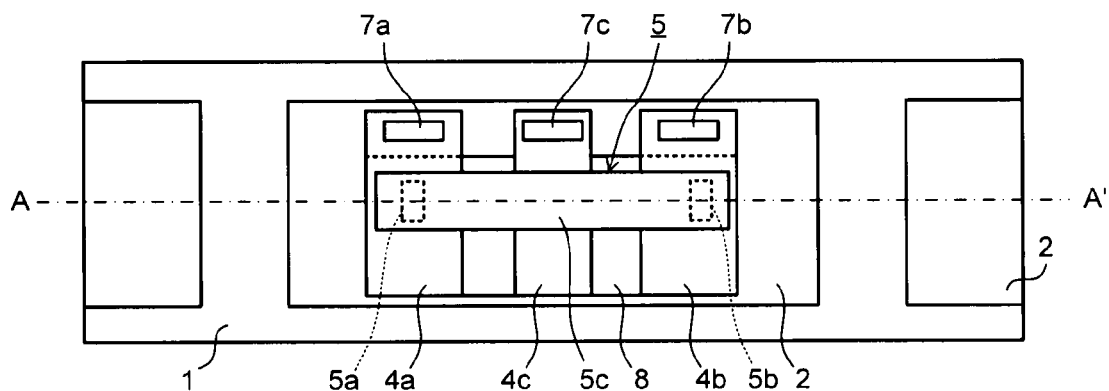
FIG. 4A is a plan view showing a structure of the MEMS device according to a second embodiment of the invention.
Figure 4B:
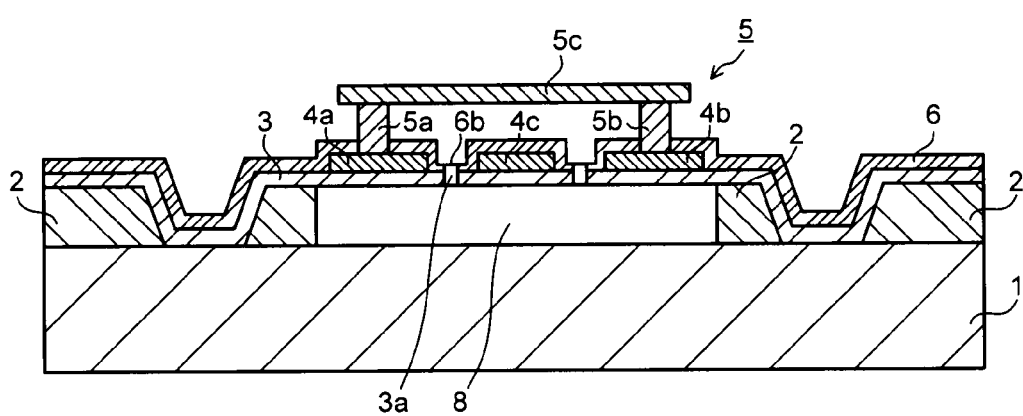
FIG. 4B is an A-A' sectional view of FIG. 4A.

A second embodiment is described below. FIG. 4A is a plan view showing a structure of the MEMS device according to the second embodiment, and FIG. 4B is an A-A' sectional view of FIG. 4A. The plan view of FIG. 4A shows a state that the inorganic insulating film and the insulating passivation film are eliminated.

As shown in FIG. 4A and FIG. 4B, the MEMS device of the second embodiment has a structure that the island-shaped insulating coated layer 2 formed on the semiconductor substrate 1 such as a silicon substrate has a hollow portion 8 in the region below the metal layer 4. The hollow portion 8 is preferably formed below the signal line 4c. Other parts are omitted from being described because they are configured in the same manner as in the first embodiment.

To suppress a decrease in strength due to the formation of the hollow portion 8 as small as possible, the hollow portion 8 may be formed only in the region just below the signal line 4c. The hollow portion 8 is desirably formed to have a frame-shaped insulating coated layer 2 which surrounds the hollow portion 8. The remaining portion of the insulating coated layer 2 has a function to reinforce the hollow portion 8. The remaining portion of the insulating coated layer 2 can be formed at both ends in the longitudinal direction of the MEMS element 5. Since a pressure is applied at the time of bonding, it is preferable that the hollow portion 8 is not provided in the regions below the connecting pads 7a, 7b of the ground lines 4a, 4b and the connecting pad 7c of the signal line 4c. Namely, it is preferable that the hollow portion 8 of the insulating coated layer 2 is formed in the region below the ground lines 4a, 4b and the signal line 4c avoiding the regions below the connecting pads 7a, 7b, 7c.

The MEMS device of the second embodiment configured as described above can be produced as follows. FIG. 5A to FIG. 5F are sectional views showing steps of producing the MEMS device of the second embodiment.

Figure 5A:
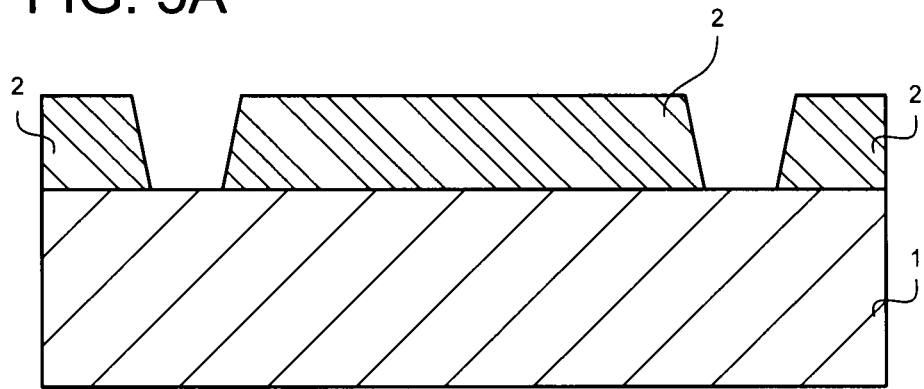
FIG. 5A to FIG. 5F are sectional views showing individual steps of a method of producing the MEMS device according to the second embodiment of the invention.

As shown in FIG. 5A, an insulation coating liquid such as photosensitive polyimide is coated on the semiconductor substrate 1 such as a silicon substrate by a spin coating method or the like and patterned by photolithography. Thus, an island-shaped insulating coated layer 2 having a thickness of 10 μm or more is formed.

Figure 5B:
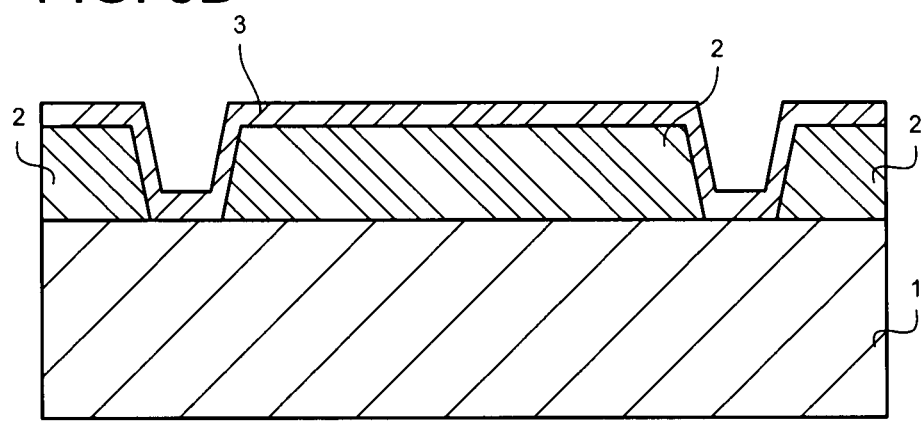

As shown in FIG. 5B, the inorganic insulating film 3 such as a $SiO_2$ film is then formed on the entire top surface of the semiconductor substrate 1 to cover the island-shaped insulating coated layer 2. The inorganic insulating film 3 is formed by a CVD method or the like using, for example, TEOS as raw material gas.

Figure 5C:
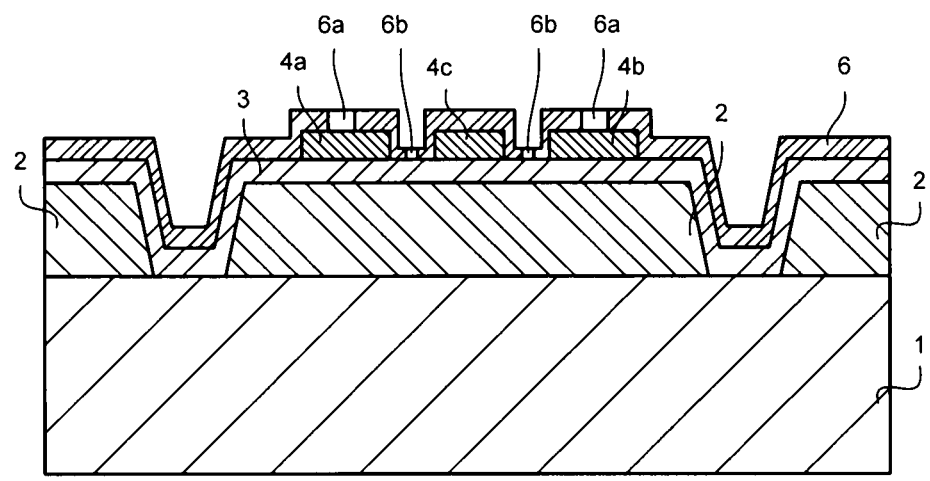

As shown in FIG. 5C, a metal thin film is then formed on the inorganic insulating film 3 in the island-shaped region, where the insulating coated layer 2 is formed, by a sputtering method, a metal deposition method or the like, and patterning is performed by photolithography and etching to form a pattern of the signal line 4c and a pattern of the ground lines 4a, 4b. Then, the insulating passivation film 6 is formed on the inorganic insulating film 3 to cover the pattern of the signal line 4c and the pattern of the ground lines 4a, 4b by the CVD method or the like, and the connecting openings 6a are formed in the insulating passivation film 6 on the ground lines 4a, 4b by photolithography and etching. At the same time, a given number of openings 6b are formed in predetermined positions of the insulating passivation film 6 (e.g., regions between the ground lines 4a, 4b and the signal line 4c) excluding the positions above the ground lines 4a, 4b and the signal line 4c.

Figure 5D:
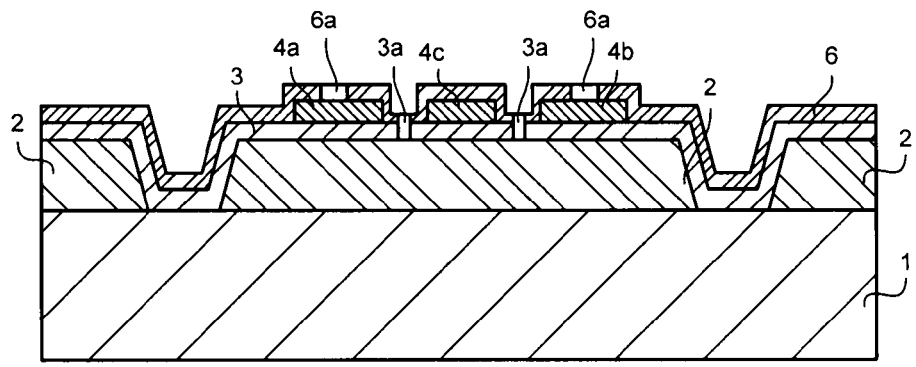

As shown in FIG. 5D, openings 3a having the same diameter are formed by etching in the inorganic insulating film 3 at the same positions as those of the openings 6b in the insulating passivation film 6. Thus, the insulating coated layer 2 of the lower layer is exposed through the openings 3a.

Figure 5E:
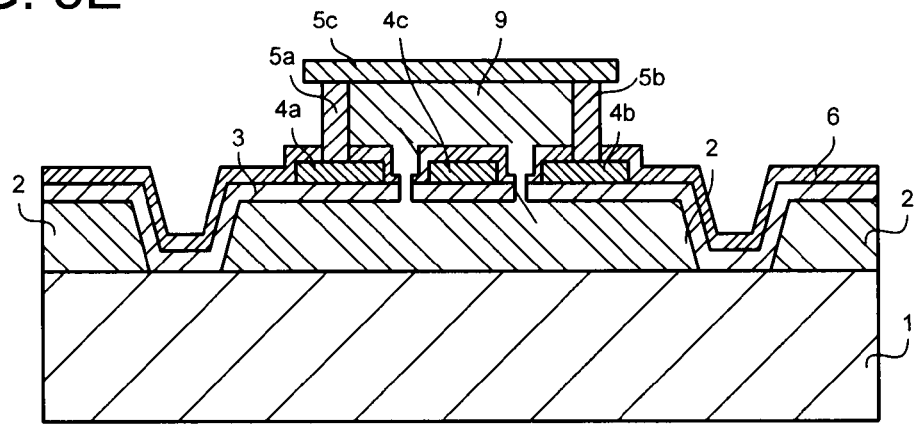

As shown in FIG. 5E, a sacrifice layer 9 is formed in a region where the signal line 4c and the ground lines 4a, 4b are formed using the same material as that of the insulating coated layer 2. The sacrifice layer 9 is formed to connect with the insulating coated layer 2 through the openings 6b of the insulating passivation film 6. And, the supporting portions 5a, 5b and the movable portion 5c of the MEMS structure body are formed on the sacrifice layer 9 by a conventional method.

Figure 5F:
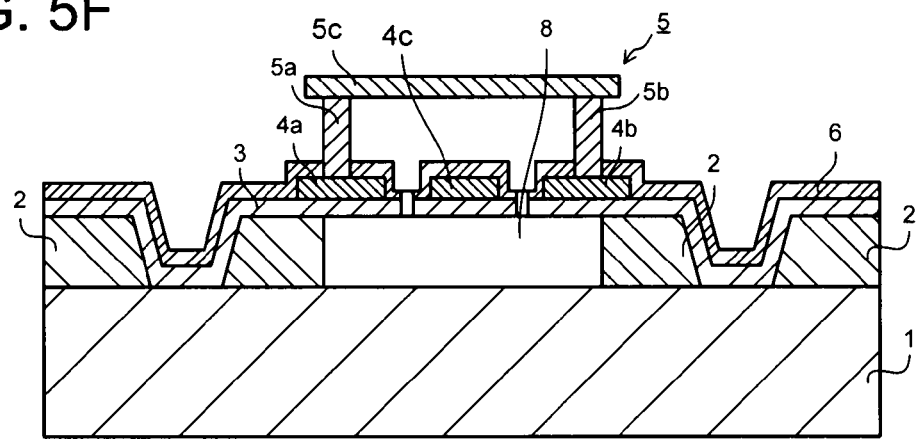

As shown in FIG. 5F, the sacrifice layer 9 is then removed by plasma etching or the like. And, when the sacrifice layer 9 is removed, the insulating coated layer 2 in the region below the ground lines 4a, 4b and the signal line 4c is also removed through the openings 3a of the inorganic insulating film 3 to form the hollow portion 8 in the insulating coated layer 2. The size and shape (planar shape) of the hollow portion 8 can be controlled by controlling the positions and quantity of the openings 3a in the inorganic insulating film 3, which are extraction holes for plasma etching, and the etching time duration and the like.

In the MEMS device of the second embodiment configured as described above, the island-shaped insulating coated layer 2 is formed on the semiconductor substrate 1, and the inorganic insulating film 3 is formed by coating thereon. Therefore, a stress due to the difference of the thermal expansion coefficient between the insulating coated layer 2 and the inorganic insulating film 3 is decreased in comparison with a structure that the insulating coated layer 2 is formed on the entire top surface of the semiconductor substrate 1. As a result, a crack is suppressed from generating in the inorganic insulating film 3.

Since the respective capacitances of the insulating coated layer 2 which is a thick film and the inorganic insulating film 3 which is a thin film are connected in series between the signal line 4c and the semiconductor substrate 1, the parasitic capacitance is decreased. And it is configured to have the hollow portion 8 in the region below the signal line 4c, and the dielectric constant of the hollow portion 8 is lower than that of the insulating coated layer 2. Thus, the parasitic capacitance is decreased more than in the first embodiment.

The invention is not limited to the embodiments described above. It is to be understood that modifications and variations of the embodiments can be made without departing from the spirit and scope of the invention. For example, the materials, structures, shapes, substrates, processes and the like described in the first and second embodiments are mere examples, and other different materials, structures, shapes, substrates, processes and the like may be used, if necessary.

What is claimed is:

1. A micro electric mechanical system device, comprising:
   a substrate;
   an island-shaped first insulating layer formed by coating a liquid insulating material on the substrate and patterning;
   a second insulating film formed on the top and side surfaces of the island-shaped first insulating layer, and having a thickness smaller than that of the island-shaped first insulating layer;
   a metal layer formed on a top surface of the second insulating film in an island-shaped region where the island-shaped first insulating layer is formed;
   a third insulating film formed on the top of the metal layer and on an area of the second insulating film in correspondence with the top and side surfaces of the island-shaped first insulating layer; and
   a micro electric mechanical system element including a supporting portion and movable portion,
      the movable portion being raised above the metal layer such that a gap is formed therebetween, and
      the supporting portion supporting the movable portion and being connected to the metal layer.

2. The device of claim 1, wherein the island-shaped first insulating layer is formed to have a planar shape which has a square island shape in a plan view.

3. The device of claim 1, wherein the second insulating film is formed on the entire surface of the substrate to cover the island-shaped first insulating layer.

4. The device of claim 1, wherein the first insulating layer has a hollow portion in the region below the metal layer.

5. The device of claim 4, wherein the metal layer has a ground line and a signal line, and the hollow portion is formed in the region below the signal line.

6. The device of claim 5, wherein the hollow portion is formed in only the region just below the signal line.

7. The device of claim 4, wherein the first insulating layer has a frame shape to surround the hollow portion.

8. The device of claim 4, wherein the remaining portion of the first insulating layer is configured to reinforce the hollow portion.

9. The device of claim 4, wherein the metal layer has a pad for connecting to the outside, and the hollow portion is formed in a region other than that below the connecting pad.

10. The device of claim 4, wherein the hollow portion is formed in a region other than those below ends in a longitudinal direction of a micro electric mechanical system element.

11. The device of claim 1, wherein the metal layer has a pair of ground lines and a signal line disposed therebetween.

12. The device of claim 11, wherein the signal line is a line for supplying a high-frequency electric signal.

13. The device of claim 11, wherein the pair of ground lines and the signal line are disposed in parallel with each other.

14. The device of claim 13, wherein the pair of ground lines and the signal line have pads for connecting to the outside on their ends on the same sides.

15. The device of claim 11, wherein
   the micro electric mechanical system element further includes a second support portion,
   the supporting portions are formed to protrude on the pair of ground lines, and
   the movable portion is mounted between the supporting portions.

16. The device of claim 15, wherein the micro electric mechanical system element is disposed at the center of one island of the island-shaped first insulating layer to have the movable portion in parallel with a longitudinal direction of the island-shaped first insulating layer.

17. The device of claim 1, wherein the micro electric mechanical system element is formed alone in correspondence with one island of the island-shaped first insulating layer.

18. The device of claim 1, wherein the second insulating film is composed of an inorganic material.

* * * * *